US011563317B1

(12) United States Patent
Nagawaram et al.

(10) Patent No.: US 11,563,317 B1
(45) Date of Patent: Jan. 24, 2023

(54) DOUBLE GROUNDED NEUTRAL FAULT DETECTION

(71) Applicant: ABB Schweiz AG, Baden (CH)

(72) Inventors: Chandrashekar Nagawaram, Hyderabad (IN); Lucas J. McPhee, Unionville, CT (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/476,818

(22) Filed: Sep. 16, 2021

(51) Int. Cl.
H02H 1/00 (2006.01)
G01R 31/52 (2020.01)
H01F 38/28 (2006.01)
H02H 3/16 (2006.01)

(52) U.S. Cl.
CPC .......... H02H 1/0007 (2013.01); G01R 31/52 (2020.01); H01F 38/28 (2013.01); H02H 3/162 (2013.01)

(58) Field of Classification Search
CPC ........ G01R 31/52; G08B 17/06; G08B 25/04; G08B 29/04; G08B 29/043; G08B 29/06; G08B 29/123; H02H 1/0007; H02H 3/08; H02H 3/24; H02H 7/20; H02H 7/268
See application file for complete search history.

(56) References Cited

U.S. PATENT DOCUMENTS

| 8,908,338 | B2 | 12/2014 | Kinsel | |
| 2004/0156155 | A1* | 8/2004 | Ward | H02H 3/338 361/42 |
| 2008/0106268 | A1* | 5/2008 | Lewinski | H02H 1/003 324/509 |
| 2010/0309592 | A1* | 12/2010 | Kinsel | H02H 3/331 361/50 |
| 2019/0128944 | A1* | 5/2019 | Englert | H02H 3/17 |

* cited by examiner

Primary Examiner — Jared Fureman
Assistant Examiner — Nicolas Bellido
(74) Attorney, Agent, or Firm — Armstrong Teasdale LLP

(57) ABSTRACT

A detector is provided that generates a leakage signal corresponding to a current imbalance between a line conductor and a neutral conductor for a load, and selectively injects a test signal into the neutral conductor. A frequency of the test signal substantially corresponds to a utility frequency. The detector measures a first value of the leakage signal, determines if the first value is less than first threshold value, and begins injection of the test signal into the neutral conductor in response to determining that the that first value is less than the first threshold value. In response to injecting the test signal, the detector measures a second value of the signal, determines if the second value is greater than a second threshold value, and disconnects the line conductor from the load in response to determining that the second value is greater than the second threshold value.

20 Claims, 10 Drawing Sheets

DOUBLE GROUNDED NEUTRAL FAULT DETECTION

BACKGROUND

The field of the disclosure relates to Alternating Current (AC) line circuits, and more particularly, to detecting adverse neutral grounding conditions for AC line circuits.

Utility supplied electrical power typically enters a premises location at an electrical panel as two hot lines L1 and L2, and a neutral conductor N, capable of supplying one hundred Amps or more. L1, L2, and N may then be segmented into a number of sub-circuits comprising i) line (e.g., L1 or L2), neutral (N), and a ground conductor (G), or ii) line-line (L1, L2), neutral (N), and a ground conductor (G) depending on the desired end voltage for the sub-circuits. At the main electrical panel for the installation, the neutral conductors and the ground conductors of the circuits are grounded to the earth, typically through one or more grounding rods driven into the ground near the electrical panel. This scenario creates a single point ground for the neutral conductors of electrical system, ensures that the neutral conductors have a voltage that is substantially tied to the earth, and facilitates a current path through the earth in case of faults that may occur when electricity inadvertently flows outside of their line-neutral or line-line-neutral circuits.

Problems can arise when neutral conductors in the premises are grounded at both the electrical panel and at another location. This situation is referred to as a double grounded neutral fault. A double grounded neutral fault provides an additional current path to the electrical panel for the current flowing in an AC circuit, which can bypass fault detection circuits and create a potential for damage. Double grounded neutral faults can also cause the fault detection circuits to trip without cause, thereby disconnecting the loads for a circuit from the electrical panel. These types of nuisance trips are undesirable, as they may encourage users to disable the protection devices and/or remove the protection devices from the circuits.

Thus, it is desirable to detect double grounded neutral faults in AC line circuits in on premise installations, in order to ensure the safety and reliability of the on-premise electrical system.

BRIEF DESCRIPTION

In one aspect, a double grounded neutral fault detector is provided. The detector includes one or more induction circuits, an interrupter circuit, and a controller. The one or more induction circuits are configured to generate a leakage signal corresponding to a current imbalance between a line conductor and a neutral conductor for a load, and selectively inject a test signal into the neutral conductor. A frequency of the test signal substantially corresponds to a utility frequency. The interrupter circuit is configured to selectively disconnect the line conductor from the load in response to receiving a control signal. The controller is configured to measure a first value of the leakage signal, to determine if the first value is less than first threshold value, and to utilize the one or more induction circuits to begin injection of the test signal into the neutral conductor in response to determining that the that first value is less than the first threshold value. In response to the one or more induction circuits injecting the test signal, the controller is further configured to measure a second value of the signal, to determine if the second value is greater than a second threshold value, and to generate the control signal in response to determining that the second value is greater than the second threshold value.

In another aspect, a method of detecting a double grounded neutral fault is provided. The method includes generating a leakage signal corresponding to a current imbalance between a line conductor and a neutral conductor for a load. The method further includes measuring a first value of the leakage signal, determining if the first value is less than a first threshold value, and begin injecting a test signal into the neutral conductor in response to determining that the first value is less than the first threshold value, where a frequency of the test signal substantially corresponds to a utility frequency. The method further includes measuring a second value of the leakage signal in response to injecting the test signal, determining if the second value is greater than a second threshold value, and disconnecting the line conductor from the load in response to determining that the second value is greater than the second threshold value.

In another aspect, a controller is provided. The controller is configured to receive a leakage signal corresponding to a current imbalance between a line conductor and a neutral conductor for a load, measure a first value of the leakage signal, determine if the first value is less than a first threshold value, and generate a test signal that is injected into the neutral conductor in response to determining that the first value is less than the first threshold value, where a frequency of the test signal substantially corresponds to a utility frequency. The controller is further configured to measure a second value of the leakage signal while the test signal is being generated, determine if the second value is greater than a second threshold value, and generate a control signal that disconnects the line conductor from the load in response to determining that the second value is greater than the second threshold value.

DRAWINGS

These and other features, aspects, and advantages of the present disclosure will become better understood when the following detailed description is read with reference to the accompanying drawings in which like characters represent like parts throughout the drawings, wherein.

Figure 1:
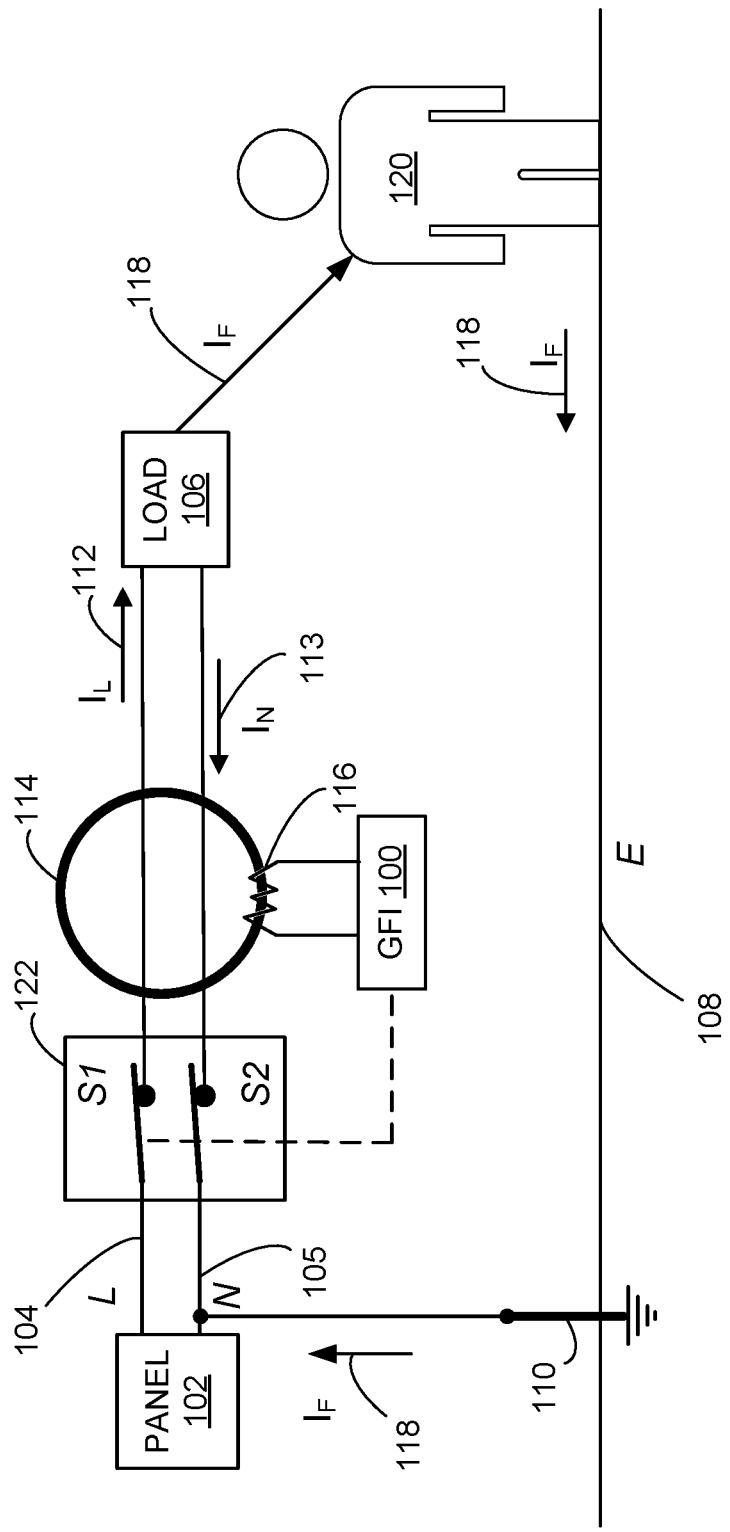
FIG. 1 depicts a known protection scheme for an electrical installation using a ground fault interrupter.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

Figure 2:
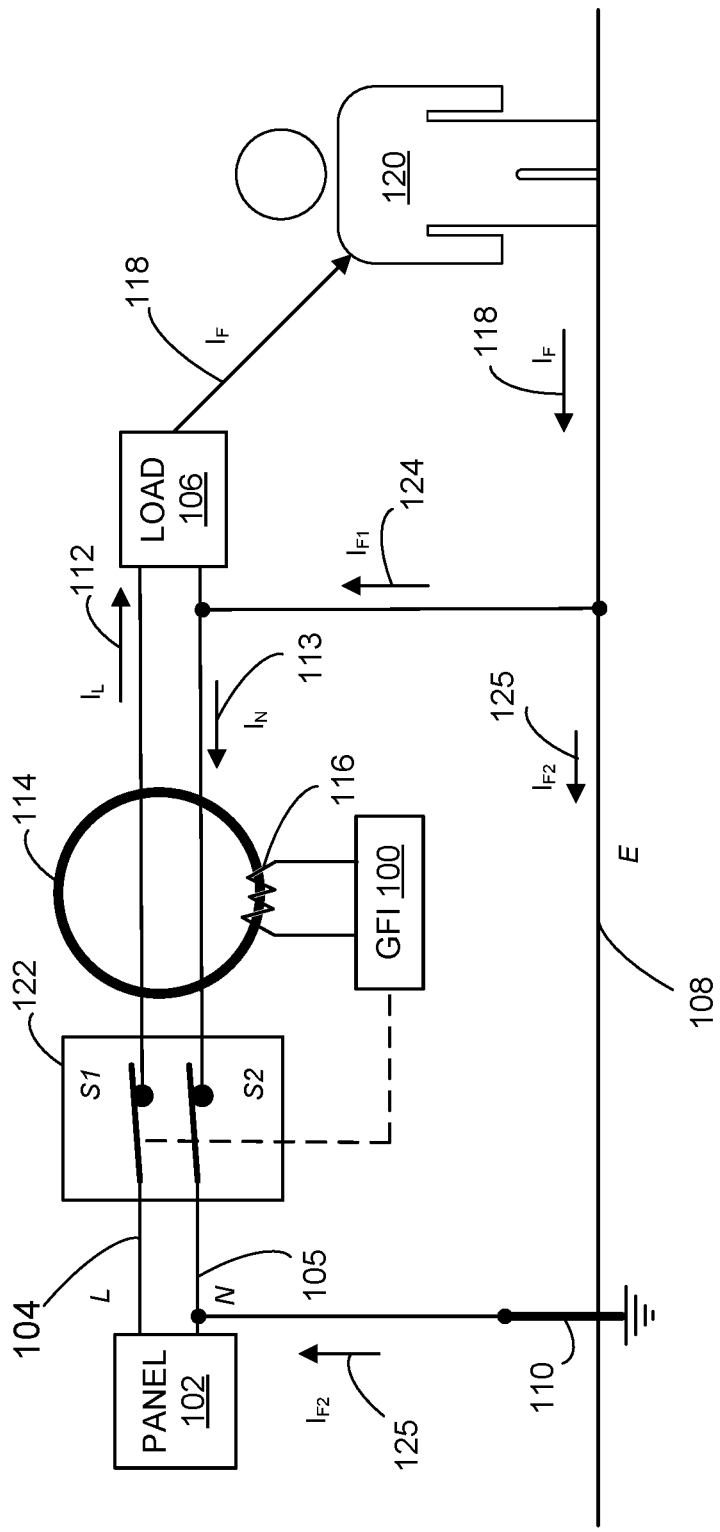
FIGS. 2 and 3 depicts the electrical installation of FIG. 1 when a double grounded neutral fault is present in the electrical installation.
Figure 3:
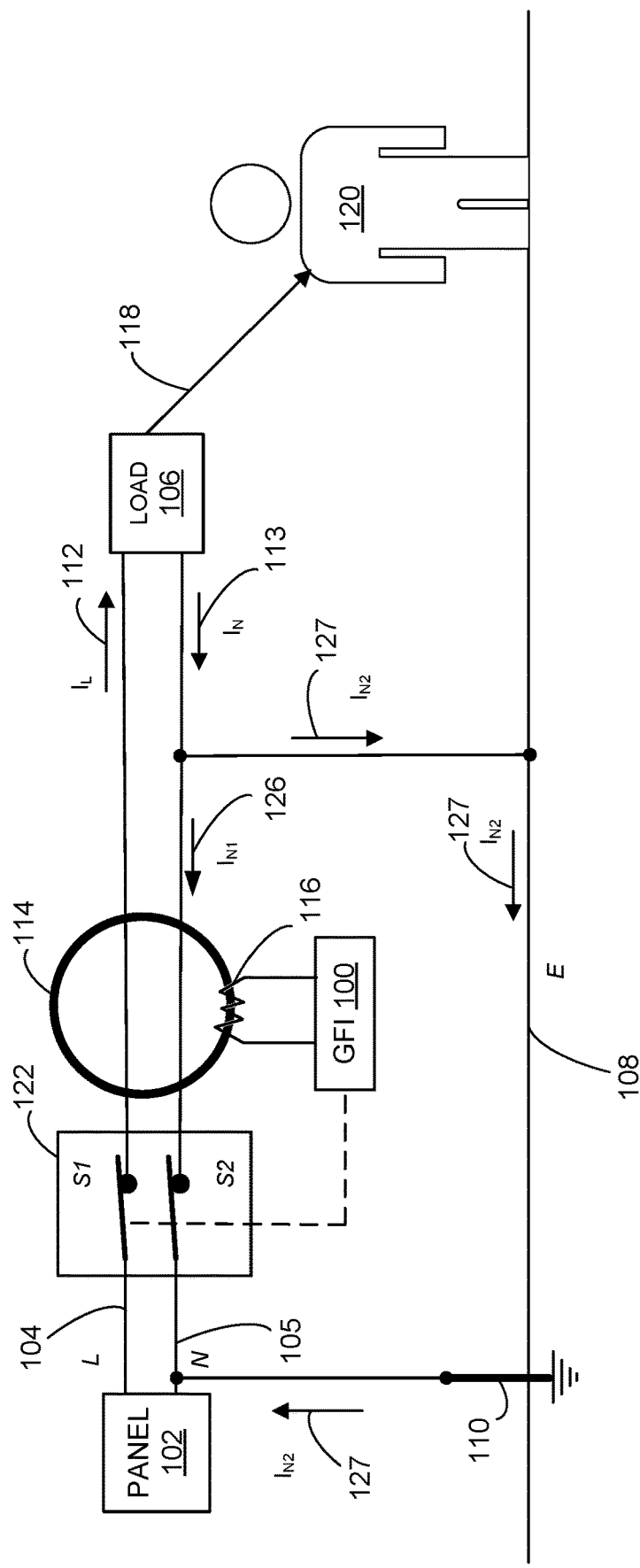

FIG. 1 depicts a known protection scheme for an electrical installation using a Ground Fault Interrupter (GFI) 100, and FIGS. 2 and 3 depict the electrical installation of FIG. 1 when a double grounded neutral fault is present in the electrical installation. GFI 100 may be referred to as a GFI Circuit (GFIC) or a Residual Current Device (RCD). The circuit depicted in FIG. 1 represents a typical single-phase Alternating Current (AC) on premise installation. The installation in FIG. 1 includes an electrical panel 102, which may represent where a utility electrical distribution system and the on-premise distribution system connect to each other. In the circuit of FIG. 1, the electrical panel 102 distributes a line conductor 104 and a neutral conductor 105 that supply electricity to a load 106 from the electrical utility. The load 106 may be, for example, a household appliance. The voltage supplied by the electrical panel 102 to the load 106 in the single-phase AC circuit shown in FIG. 1 may be 230 volts or 120 volts, depending on the standards in place for the installation. For example, the voltage for single-phase AC in the United States is 120 volts (at 60 hertz), while the voltage for single-phase AC in Germany is 230 volts (at 50 hertz). In the circuit depicted in FIG. 1, the supply neutral (N) from the electrical utility is connected directly to the earth 108 using one or more grounding rods 110. Typically, the grounding rod(s) 110 are driven into the earth 108 near the electrical panel 102. In FIG. 1, the installation is protected by the GFI 100, which detects ground faults and operates to disconnect the load 106 from the electrical panel 102 during a ground fault.

Under normal conditions, a line current (IL) 112 flows through the line conductor 104 between the electrical panel 102 and the load 106 and a neutral current ($I_N$) 113 flows through the neutral conductor 105 between the electrical panel 102 and the load 106. The line current 112 and the neutral current 113 alternate directions each half phase of a complete AC cycle. In FIG. 1, the line current 112 and the neutral current 113 are depicted during a single half phase for purposes of discussion. In an alternate half phase, the line current 112 and the neutral current 113 reverse direction, but the discussion applies equally whether the line current 112 and the neutral current 113 flow in the directions depicted in FIG. 1 or a reverse direction.

In FIG. 1, the line conductor 104 and the neutral conductor 105 pass through the center of a current transformer 114 and form the primary windings of the current transformer 114. A secondary winding 116 of the current transformer 114 is connected to the GFI 100. In normal operation of the circuit depicted in FIG. 1, a fault current 118 is zero or substantially zero, and the magnitudes of the line current 112 and the neutral current 113 flowing through the current transformer 114 are the same, but they flow in opposite directions such that the resulting vector sum of the line current 112 and the neutral current 113 at the current transformer 114 is about zero. Accordingly, little to no current is induced on the secondary winding 116 of the current transformer 114. However, if a person 120 is subjected to the voltages on the line conductor 104, a non-zero fault current 118 flows through the body of the person 120 to the earth 108 and returns to the grounded neutral conductor 105 at the electrical panel 102 through the grounding rod(s) 110.

The result of the fault current 118 bypassing the current transformer 114 is that the line current 112 flowing through the current transformer 114 has a higher magnitude than the neutral current 113 flowing through the current transformer 114, since a portion of the line current 112 is now bypassing the current transformer 114 as the fault current 118. In this ground fault condition, the vector sum of the line current 112 to the load 106 and the neutral current 113 from the load 106 through the current transformer 114 is non-zero, resulting in an induced current in the secondary winding 116 of the current transformer 114. The GFI 100 detects the current in the secondary winding 116, and if the current exceeds a threshold current, then the GFI 100 opens a switch 122 to disconnect the line conductor 104 and the neutral conductor 105 from the load 106, which terminates the ground fault.

The ability of the GFI 100 to detect the current imbalance through the current transformer 114 and provide protection to the person 120 depends upon the single point neutral conductor ground at the electrical panel 102. However, certain double grounded neutral scenarios allow the fault current 118 to bypass the protection of GFI 100, as illustrated in FIG. 2.

In the circuit of FIG. 2, a load side of the neutral conductor 105 has been inadvertently tied to the earth 108. This type of condition is typically referred to as a double grounded neutral fault. Double grounded neutral faults may occur for a variety of reasons, including miswiring of the load 106, neutral wire insulation breakdowns, etc. In this condition, the fault current 118 flowing through the body of the person 120 is split between the load-side neutral connection to the earth 108 at the neutral conductor 105 and the current path through the earth 108 previously described with respect to FIG. 1. The fault current 118 is split into two components, a first fault current (IF') 124 and a second fault current (IF2) 125. The first fault current 124 returns to the neutral conductor 105 at the load 106 and flows through the current transformer 114. The second fault current 125 bypasses the current transformer 114 and returns to the neutral conductor 105 at the electrical panel 102 via the grounding rod(s) 110. The result is that the current transformer 114 no longer senses the full differential current between the line conductor 104 and the neutral conductor 105 based on the fault current 118, but rather, senses a lower differential current between the line conductor 104 and the neutral conductor 105 that is based on the second fault current 125, which is less than the fault current 118. If the second fault current 125 is below a trip point of the GFI 100, then the GFI 100 will not operate the switch 122 to disconnect the load 106 from the electrical panel 102, and the fault current 118 may continue to flow unimpeded through the body of the person 120, which is undesirable.

In addition to the loss of protection problems that can arise in the double grounded neutral fault condition depicted in FIG. 2, double grounded neutral faults can also cause the GFI 100 to generate nuisance trips that open the switch 122 even when the fault current 118 is substantially zero, as depicted in FIG. 3. In the circuit of FIG. 3, the neutral current 113 from the load 106 is split between the load-side neutral connection to the earth 108 at the neutral conductor 105 and the current path through the earth 108 to the grounding rod(s) 110 at the electrical panel 102. The neutral current 113 is split into two components, a first neutral current ($I_{N1}$) 126 and a second neutral current ($I_{N2}$) 127. The first neutral current 126 flows through the current transformer 114. The second neutral current 127 bypasses the current transformer 114 and returns to the neutral conductor 105 at the electrical panel 102 via the grounding rod(s) 110. The result is that the current transformer 114 senses a differential current between the line conductor 104 and the neutral conductor 105 that is based on the second neutral current 127. If the second neutral current 127 is above a trip point of the GFI 100, then the GFI 100 will operate the switch 122 and disconnect the load 106 from the electrical panel 102, even though the fault current 118 may be substantially zero (e.g., no ground fault is present). These types of nuisance trips are disruptive and undesirable. Further, nuisance trips may encourage people to bypass or remove fault protection devices for AC line circuits, which is undesirable.

The embodiments described herein provide for detecting double grounded neutral faults using a test signal injected into a neutral conductor for an AC line circuit. When a neutral conductor for the AC line circuit is double grounded, a current loop exists that can be analyzed using the test signal.

Figure 4:
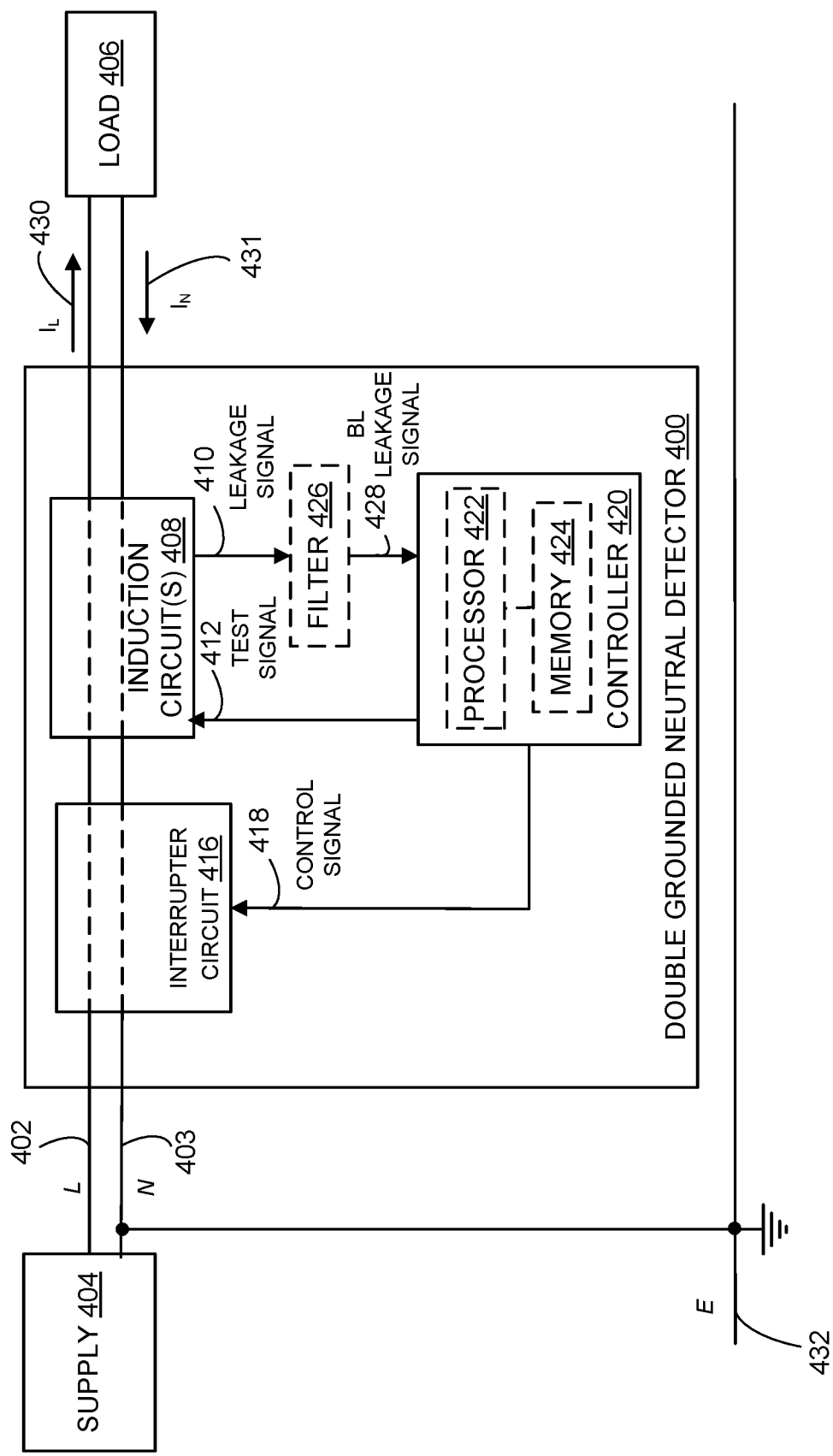
FIG. 4 is a block diagram of a double grounded neutral detector in an example embodiment.

FIG. 4 is a block diagram of a double grounded neutral detector 400 in an example embodiment. The detector 400 in this embodiment couples a line conductor 402 and a neutral conductor 403 between a supply 404 and a load 406. The neutral conductor 403 is grounded to the earth 432 at the supply 404. The detector 400 performs an analysis using a test signal 412 injected into the neutral conductor 403 to determine if the neutral conductor 403 is double grounded. If the neutral conductor 403 is double grounded, then the detector 400 disconnects at least the line conductor 402 of the supply 404 from the load 406. In the embodiments described herein, the line conductor 402 includes one or more electrical conductors that collectively form a current supply path between the supply 404 to the load 406. Further in the embodiments described herein, the neutral conductor 403 includes one or more electrical conductors that collectively form a current path between the load 406 and the supply 404.

Under normal conditions, a line current ($I_L$) 430 flows through the line conductor 402 between the supply 404 and the load 406 and a neutral current ($I_N$) 431 flows through the neutral conductor 403 between the load 406 and the supply 404. The line current 430 and the neutral current 431 alternate directions each half phase of a complete cycle of the AC power waveform. In FIG. 4, the line current 430 and the neutral current 431 are depicted during a single half phase for purposes of discussion. In an alternate half phase, the line current 430 and the neutral current 431 reverse direction, but the discussion applies equally whether the line current 430 and the neutral current 431 flow in the directions depicted in FIG. 4 or a reverse direction.

In this embodiment, the detector 400 includes one or more induction circuits 408. The induction circuits 408 include any component, system, or device that generates a leakage signal 410 corresponding to a current imbalance between the line conductor 402 and the neutral conductor 403 for the load 406. In addition, the induction circuits 408 include any component, system, or device that selectively injects the test signal 412 into the neutral conductor 403 during a testing phase to determine if the neutral conductor 403 is double grounded. In this embodiment, the frequency of the test signal substantially corresponds to a utility frequency of the AC power provided by the supply 404. In various embodiments, the utility frequency is 50 hertz or 60 hertz. In some embodiments, the induction circuits 408 include one or more current transformers, which measure a differential current between the line conductor 402 and the neutral conductor 403 for the load 406 and generate the leakage signal 410 corresponding to the difference. In these embodiments, the one or more current transformers are also used to selectively inject the test signal 412 into the neutral conductor 403.

In this embodiment, the detector 400 further includes an interrupter circuit 416. The interrupter circuit 416 includes any component, system, or device that selectively disconnects at least the line conductor 402 between the supply 404 and the load 406 in response to receiving a control signal 418. For example, the interrupter circuit 416 may include one or more normally closed switches that selectively open in response to receiving the control signal 418. The switches may include mechanical relays and/or solid-state relays in various embodiments. In some embodiments, the interrupter circuit 416 selectively disconnects both the line conductor 402 and the neutral conductor 403 between the supply 404 and the load 406 in response to receiving the control signal 418.

The detector 400 in this embodiment further includes a controller 420. Controller 420 includes any component, system, or device that controls the operation of the detector 400 as described herein. In some embodiments, the controller 420 includes a processor 422 and a memory 424. The processor 422 includes any electronic circuits and/or optical circuits that are able to perform the functions described herein for the controller 420. The memory 424 includes any electronic circuits, optical circuits, and/or magnetic circuits that are able to store data. For instance, the memory 424 may store information regarding the utility frequency in use in different countries, with an installer of the detector 400 selecting the correct utility frequency during installation. In an embodiment, the memory 424 stores programmed instructions which, when executed by the processor 422, directs the processor 422 to implement the operation of the detector 400 as described herein.

In some embodiments, the detector 400 includes a filter 426. The filter 426 includes any component, system, or device that band-limits the leakage signal 410 to generate a band-limited leakage signal 428. The band-limited leakage signal 428 has a bandwidth that includes the utility frequency (e.g., 50 Hz or 60 Hz) and at least one corner frequency that is offset from the utility frequency by a threshold frequency (e.g, a threshold frequency of about 3 hertz). The filter 426 may be used in some embodiments to mitigate the effects of harmonic currents generated by the load 406 in the line conductor 402 and the neutral conductor 403. Harmonic currents arise when the load 406 is a non-linear load, such as a switching power supply, a rectifier, discharge lighting, etc. When the load 406 is a non-linear load, then the current waveform for the load 406 varies from a sinusoid, which generates noise on the line conductor 402 and/or the neutral conductor 403. The noise may have a frequency spectrum up to about 20 kHz or even higher in some implementations, which is mitigated in some embodiments by filtering the leakage signal 410 to suppress signals that have frequencies that lie outside of the utility frequency. Generally, the frequencies of interest to the detector 400 are at or about the utility frequency, which will be discussed in more detail below.

In some embodiments, the filter 426 may include a band-pass filter centered substantially around the utility frequency, with corner frequencies that include an expected frequency drift of the utility frequency. In most countries, the acceptable frequency drift for the utility frequency is about 2 hertz. In a 60 hertz implementation, the acceptable utility frequency seen by the load 406 may be from about 58 hertz to about 62 hertz. Since the leakage signal 410 may include broadband noise in a frequency range up to about 20 kHz or higher in some installations, the filter 426 may be used to substantially reduce the power spectrum of signals outside of the utility frequency. In some embodiments, the filter 426 has a bandwidth of about 6 hertz, resulting in the same bandwidth in the band-limited leakage signal 428. In other embodiments, the filter 426 has a Q factor of at least about 10, of at least about 15, of at least about 20, of at least about 25, or some other value that is suitable for mitigating the broadband noise in the line conductor 402 and/or the neutral conductor 403 at about the utility frequency. The Q factor of the filter 426 is the ratio of the center frequency of the filter 426 to the bandwidth of the filter 426. For example, if the center frequency of the filter 426 is 60 hertz and the Q factor is 30, then the bandwidth of the filter 426 (and correspondingly the bandwidth of the band-limited leakage signal 428 generated by the filter 426 from the leakage signal 410) is about 2 hertz.

Figure 5:
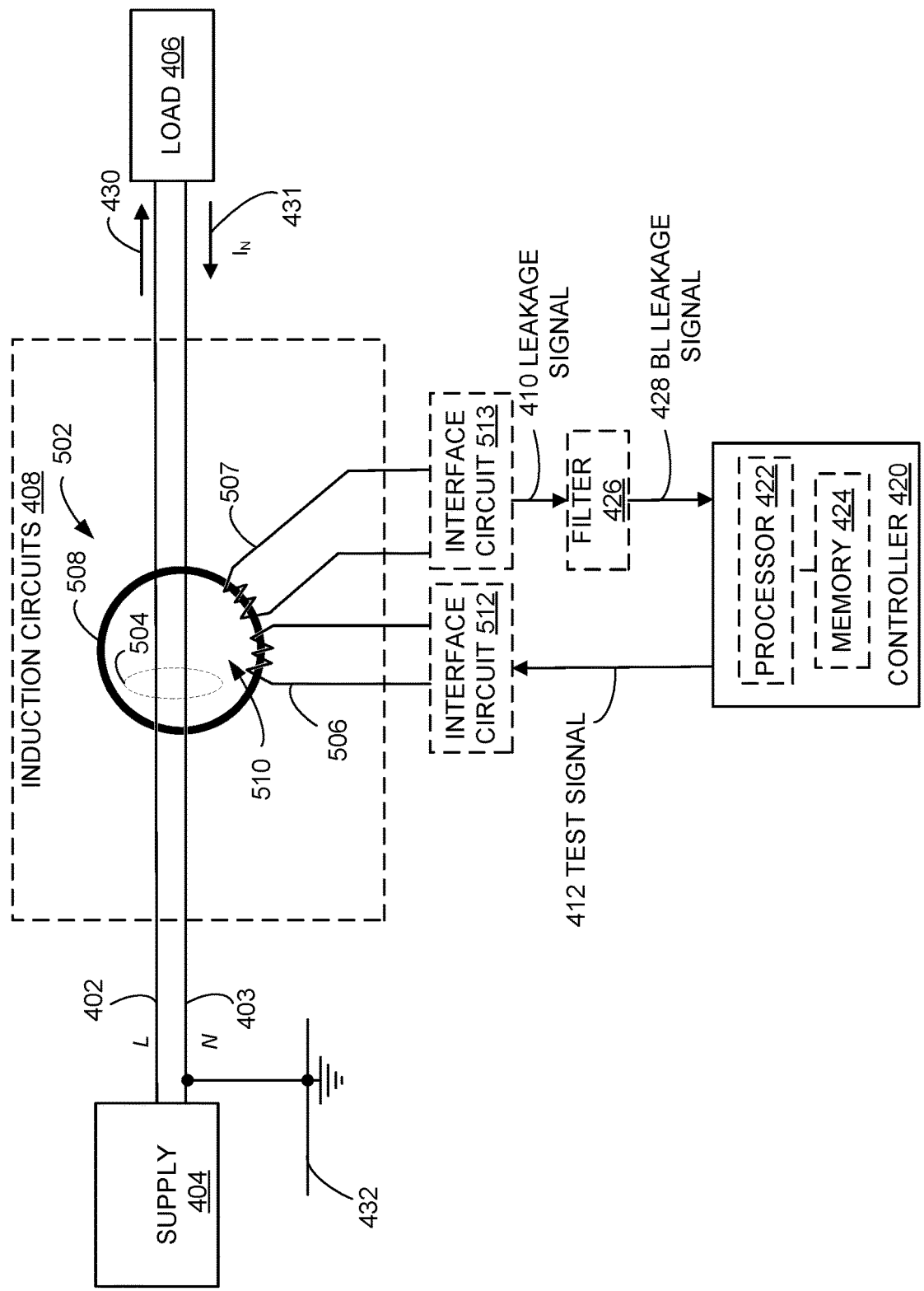
FIG. 5 depicts a first configuration of a current transformer circuit for the detector of FIG. 4 in an example embodiment.

FIG. 5 depicts a first configuration of the induction circuits 408 for the detector 400 in an example embodiment. In this embodiment, the induction circuits 408 includes a current transformer 502. The current transformer 502 includes primary windings 504 formed from the line conductor 402 and the neutral conductor 403, and at least two secondary windings 506 and 507 magnetically coupled to the primary windings 504. The secondary winding 506 is used to inject the test signal 412 into the neutral conductor 403, and the secondary winding 507 generates the leakage signal 410 based on the differential current flowing between the line conductor 402 and the neutral conductor 403 through the current transformer 502.

In an embodiment, the current transformer 502 includes a core 508 that is metallic, and the primary windings 504 pass through an inner region 510 of the core 508. In this embodiment, the secondary windings 506 and 507 wrap around the core 508. In some embodiments, the core 508 is an air core.

In some embodiments, a first interface circuit 512 communicatively couples the test signal 412 to the secondary winding 506 (e.g., converts a single-ended test signal 412 to a differential signal on the secondary winding 506), and a second interface circuit 513 communicatively couples to the secondary winding 507 to generate the leakage signal 410 (e.g., converts a differential signal on the secondary winding 507 to a single-ended leakage signal 410). In one embodiment, the first interface circuit 512 for the test signal 412 comprises an oscillator that operates at the utility frequency, and the test signal 412 comprises a logic-level signal used to enable and disable the first interface circuit 512. In another embodiment, the test signal 412 comprises a sinusoidal signal generated by the controller 420 at the utility frequency, and the first interface circuit 512 comprises a differential amplifier circuit that excites the secondary winding 506 based on the test signal 412.

Figure 6:
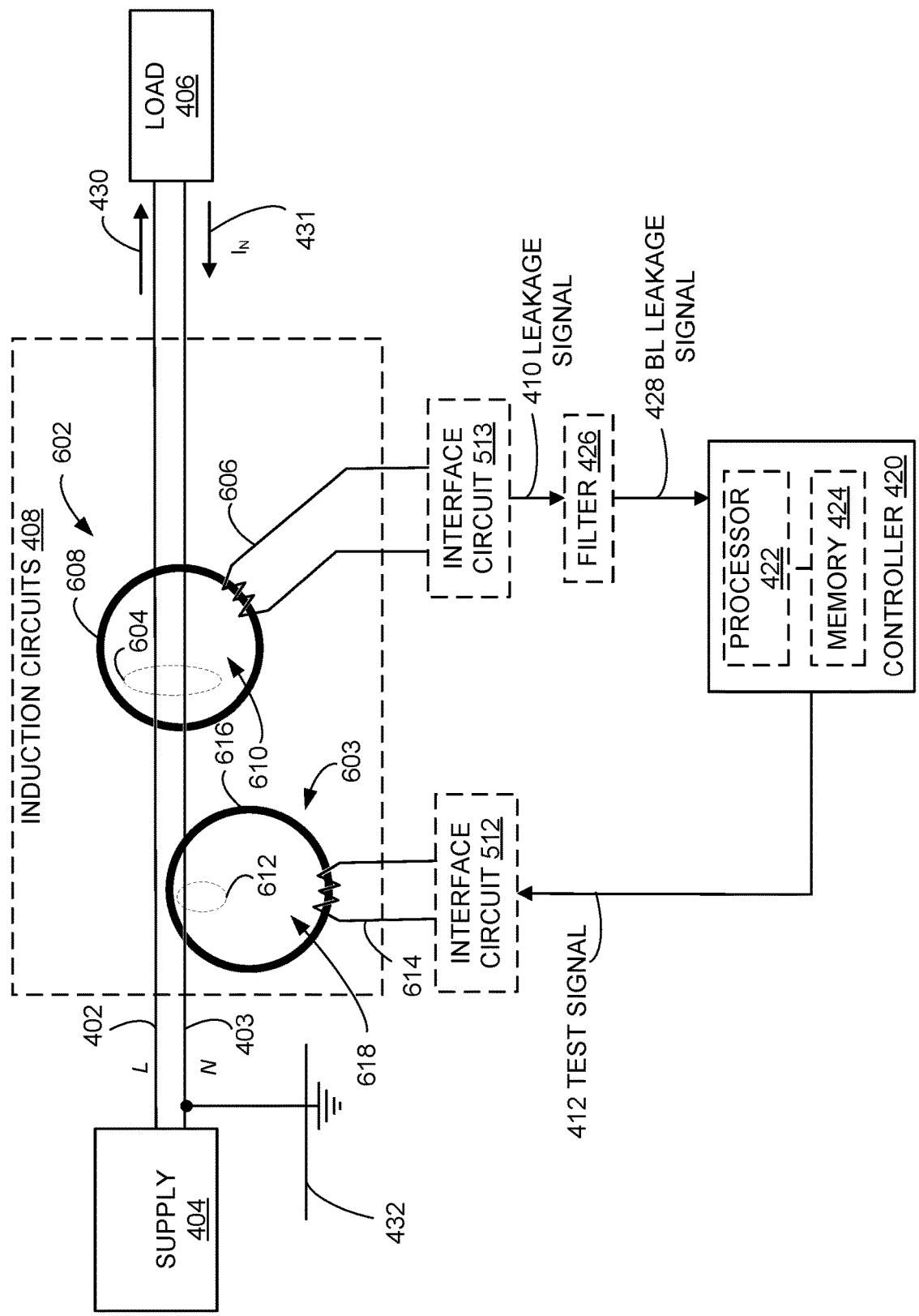
FIG. 6 depicts a second configuration of a current transformer circuit for the detector of FIG. 4 in another example embodiment.

FIG. 6 depicts a second configuration of the induction circuits 408 for the detector 400 in another example embodiment. In this embodiment, the induction circuits 408 include a first current transformer 602 and a second current transformer 603. The first current transformer 602 includes primary windings 604 formed from the line conductor 402 and the neutral conductor 403, and a secondary winding 606 magnetically coupled to the primary windings 604. The secondary winding 606 generates the leakage signal 410 based on the differential current flowing between the line conductor 402 and the neutral conductor 403 at the first current transformer 602. In one embodiment, the first current transformer 602 includes a core 608 that is metallic, and the primary windings 604 pass through an inner region 610 of the core 608. In this embodiment, the secondary winding 606 wraps around the core 608. In some embodiments, the core 608 is an air core. The second interface circuit 513 in this embodiment is coupled to the secondary winding 606 of the first current transformer 602 and operates similarly to what was previously described in FIG. 5 with respect to the leakage signal 410.

In this embodiment, the second current transformer 603 includes a primary winding 612 formed from the neutral conductor 403, and a secondary winding 614 magnetically coupled to the primary winding 604. The secondary winding 614 is used to inject the test signal 412 into the neutral conductor 403. In one embodiment, the second current transformer 603 includes a core 616 that is metallic, and the primary winding 612 passes through an inner region 618 of the core 616. In this embodiment, the secondary winding 614 wraps around the core 616. In some embodiments, the core 608 is an air core. The first interface circuit 512 in this embodiment is coupled to the secondary winding 614 of the second current transformer 603 and operates similarly to what was previously described in FIG. 5 with respect to the test signal 412.

Figure 7:
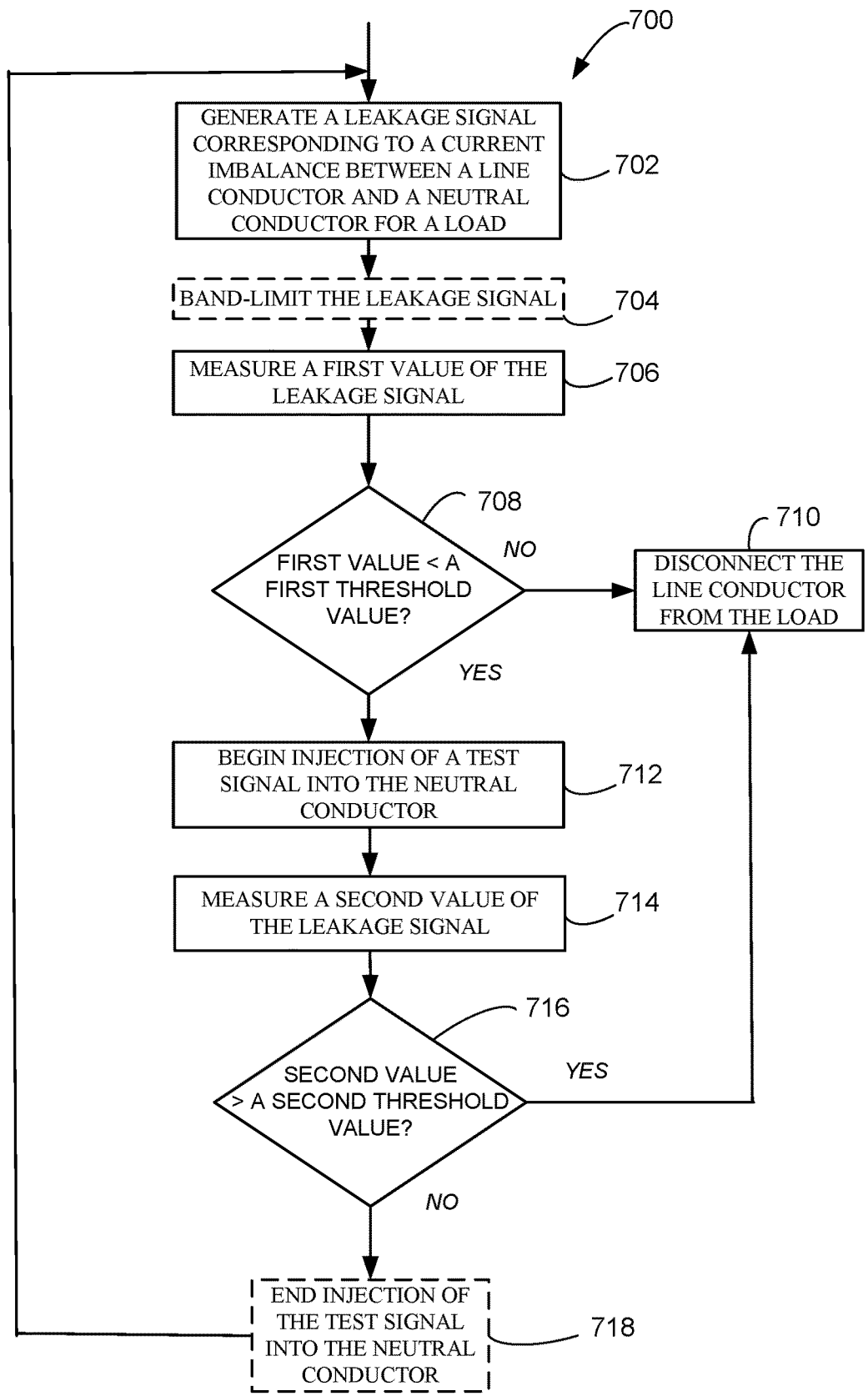
FIG. 7 is a flow chart of a method of detecting double grounded neutral faults in an example embodiment.
Figure 8:
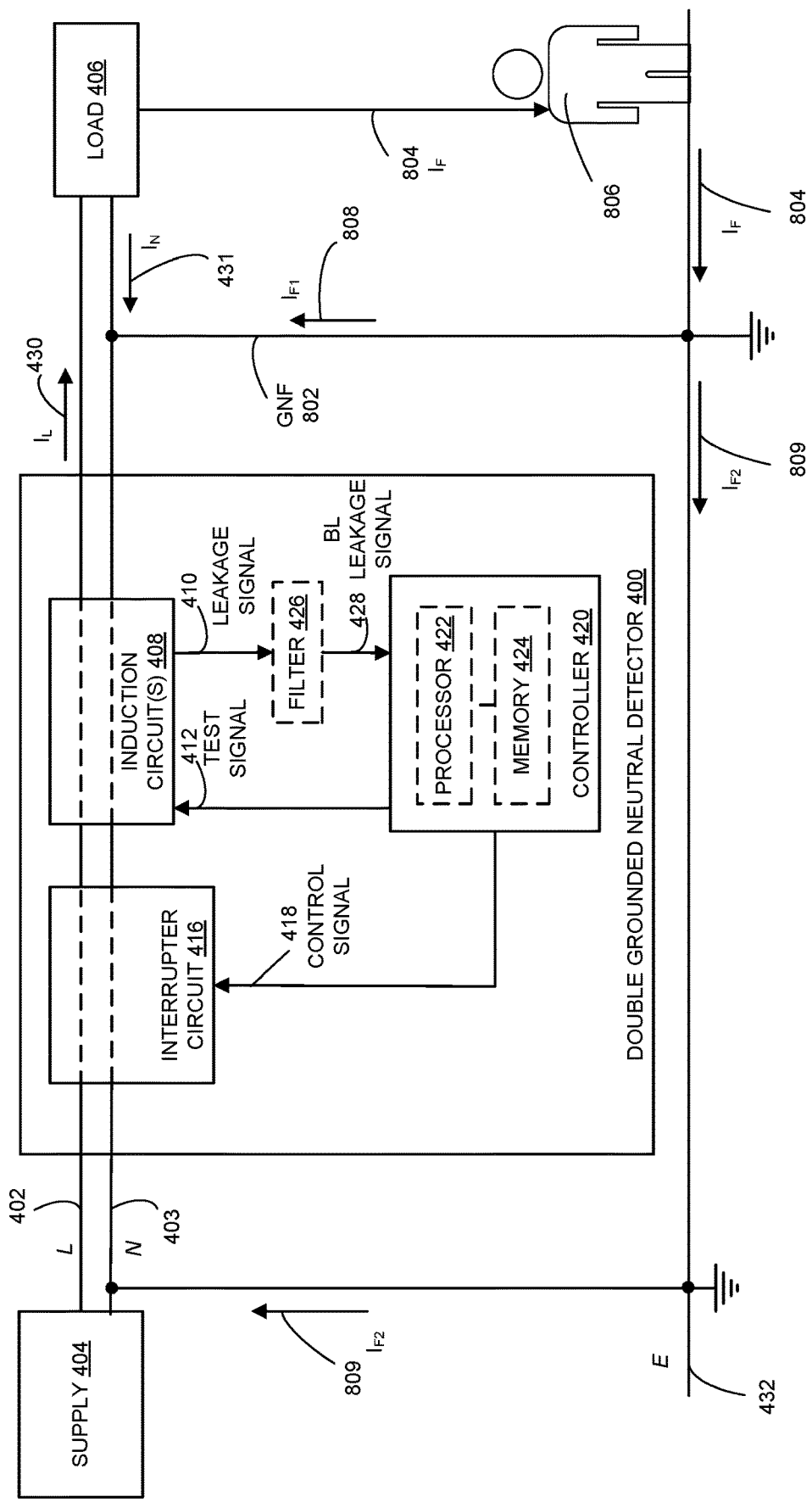
FIGS. 8-10 are block diagrams of the detector of FIG. 4 when a double grounded neutral fault is present during various fault scenarios in example embodiments.
Figure 9:
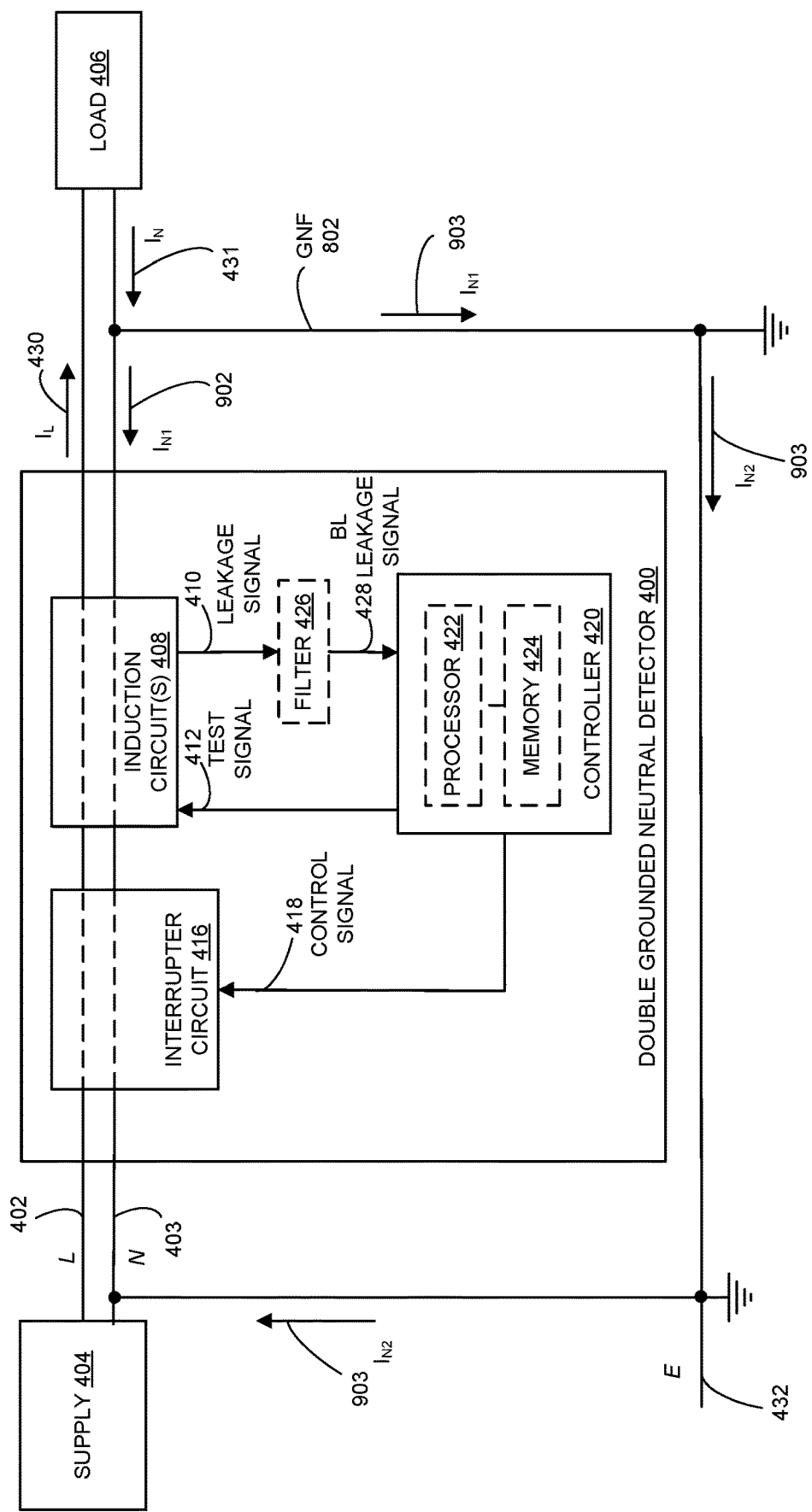
Figure 10:
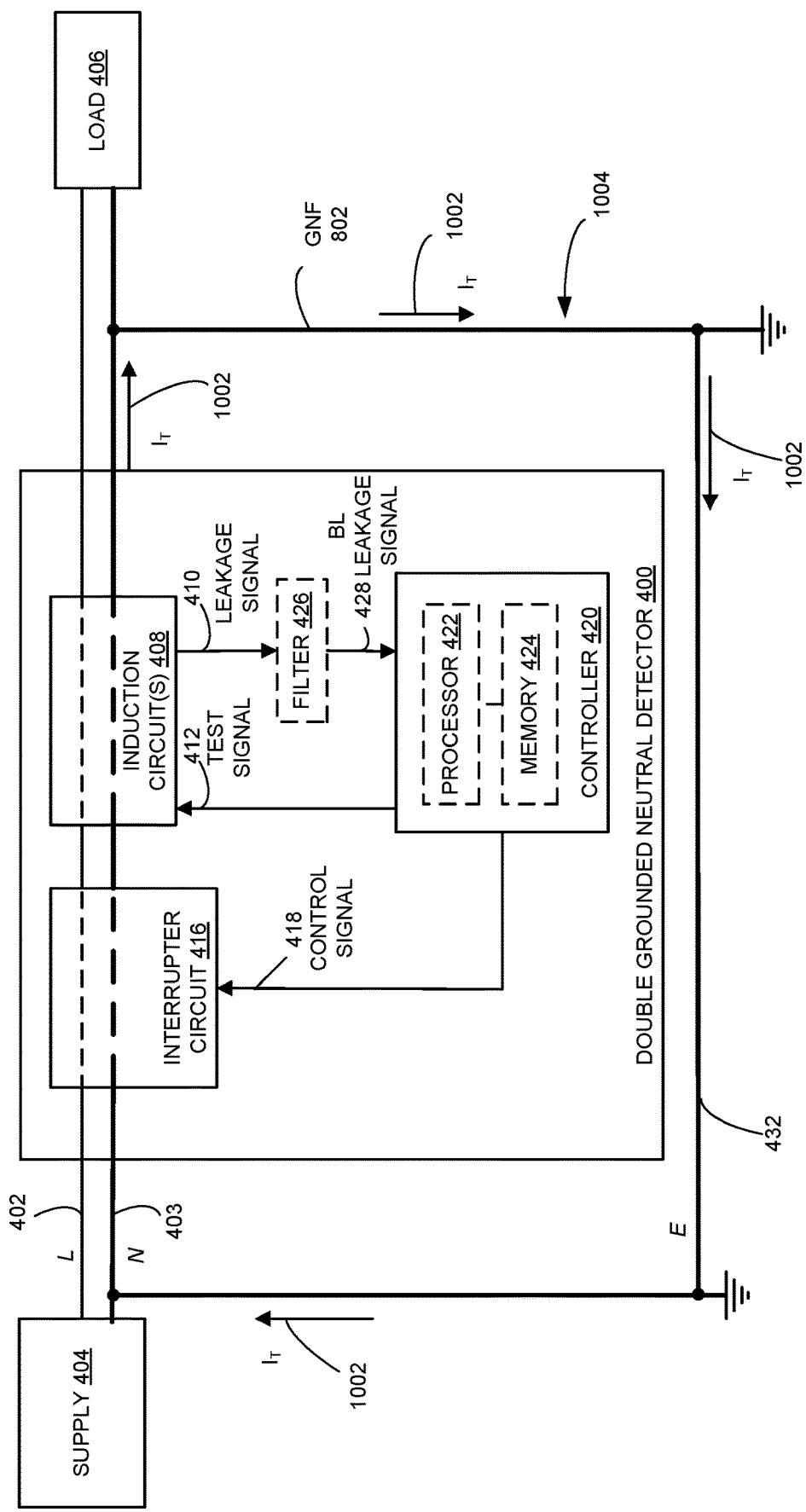

FIG. 7 is a flow chart of a method 700 of detecting a double grounded neutral fault in an example embodiment, and FIGS. 8-10 are block diagrams of the detector 400 when a double grounded neutral fault is present during various fault scenarios in example embodiments. The method 700 will be discussed with respect to the detector 400, although the method 700 may be performed by other systems, not shown. The steps of the method 700 are not all inclusive, and the method 700 may include other steps that are not shown. Further, the steps of the method 700 may be performed in an alternative order.

Consider that the detector 400 is in operation. During normal conditions as depicted in FIG. 4, the line current 430 and the neutral current 431 sensed by the induction circuits 408 are equal and they flow in the opposite directions through the inductions circuits 408, with the resulting vector sum of the line current 430 and the neutral current 431 being about zero. Consequentially, the leakage signal 410 is about zero. In FIG. 8, the neutral conductor 403 is double grounded to the earth 432, forming a Grounded Neutral Fault (GNF) 802 between the load 406 and the detector 400. The GNF 802 represents a current path between the neutral conductor 403 at the load 406 and the earth 432. During operation of the detector 400, the induction circuits 408 generate the leakage signal 410 corresponding to the differential current flowing in the line conductor 402 and the neutral conductor 403 at the induction circuits 408 (see step 702 of FIG. 7).

In some embodiments, it may be desirable to band-limit the leakage signal 410 in order to mitigate harmonic current noise generated by the load 406, which may obscure information in the leakage signal 410 used by the controller 420 during operation. For example, noise in the leakage signal 410 may mask or obscure the response to injecting the test signal 412 at the utility frequency into the neutral conductor 403. In these embodiments, the leakage signal 410 is received by the filter 426, and the filter 426 band-limits the leakage signal 410 to generate the band-limited leakage signal 428 (see step 704).

Controller 420 measures a first value of the leakage signal 410 (see step 706) or the band-limited leakage signal 428 in some embodiments and determines if the first value is less than a first threshold value (see step 708). In some cases, the first value is greater than the first threshold value. For example, if a ground fault is in progress, then a fault current 804 flowing through the body of a person 806 is split between the GNF 802 at the load 406 and the current path through the earth 432 to the supply 404. The fault current 804 is split into two components, a first fault current (IF') 808 and a second fault current (IF2) 809. The first fault current 808 returns to the neutral conductor 105 at the load 406 and flows through the induction circuits 408. The second fault current 809 bypasses the induction circuits 408 and returns to the neutral conductor 403 at the supply 404. In this condition, the first value measured by the controller 420 will be greater than the first threshold value due to the current imbalance of the line conductor 402 and the neutral conductor 403 at the induction circuits 408, and the controller 420 generates the control signal 418 to disconnect at least the line conductor 402 from the load 406 to terminate the ground fault (see step 708 of FIG. 7). Generally, the first threshold value is selected to ensure that a ground fault can be detected even when the GNF 802 is present and the second fault current 809 bypasses the induction circuits 408.

Another example of when the first value might be greater than the first threshold value occurs if no ground fault exists and the load 406 is drawing electrical power, as depicted in FIG. 9. In this case, the neutral current 431 at the load 406 splits, with a first neutral current 902 flowing through the induction circuit 408 and a second neutral current 903 bypassing the induction circuit 408 through the GNF 802 conduction path to the supply 404. The first value measured by the controller 420 is greater than the first threshold value due to the current imbalance of the line conductor 402 and the neutral conductor 403 at the induction circuits 408 (based on the second neutral current 903), and the controller 420 generates the control signal 418 to disconnect at least the line conductor 402 from the load 406 to terminate the ground fault (see step 710). In this case, the load current 430 itself forms the test signal used to determine whether GNF 802 exists in the circuit and generating a test signal (described below) is not needed. Generally, the first threshold value is selected to ensure that the GNF 802 can be detected even when the second neutral current 903 bypasses the induction circuits 408.

In some cases, the first value of the leakage signal 410 (or the band-limited leakage signal 428) measured by the controller 420 is less than the first threshold value. For example, if the load 406 is not drawing electrical power, then first value may be about zero even when GNF 802 is present, as the load current 430 is not available as a test signal to detect GNF 802. When the first value is less than the first threshold value, then the controller 420 begins injection of the test signal 412 into the neutral conductor 403 using the induction circuits 408 (see step 712 and FIG. 10). When the GNF 802 is present in the circuit, a test current 1002 flows in a current loop 1004 as depicted in FIG. 10, with the magnitude of the test current 1002 depending on the conductivity of the current loop 1004. A current loop does not exist for the line conductor 402, so the test current 1002 generates a differential current between the line conductor 402 and the neutral conductor 403 at the induction circuits 408, and correspondingly, the induction circuits 408 generate a non-zero value for the leakage signal 410 (or the band-limited leakage signal 428).

While the test signal 412 is being injected, the controller 420 measures a second value of the leakage signal 410 (or the band-limited leakage signal 428, see step 714). In response to measuring the second value, the controller 420 determines if the second value is greater than the second threshold value (see step 716). In some cases, the second value of the leakage signal 410 (or the band-limited leakage signal 428) measured by the controller 420 is less than the second threshold value. For example, if the GNF 802 is not present in the circuit in FIG. 10, then the current loop 1004 formed by GNF 802 does not exist, and consequentially, the test current 1002 may be about zero. As a result, the leakage signal 410 generated by the induction circuits 408 may be about zero. In some embodiments, the controller 420 ends the injection of the test signal 412 (see step 718) and processing returns to step 702. If, however, the second value measured by the controller 420 is greater than the second threshold value, then the controller 420 generates the control signal 418 to disconnect at least the line conductor 402 from the load 406 (see step 710). Generally, the second threshold value is selected to ensure that the GNF 802 can be detected, without generating nuisance disconnects of the load 406. For example, the second threshold value is selected in some embodiments based on standards that define the maximum allowable conductance in the current loop 1004. In some embodiments, the second threshold value is selected to ensure that the control signal 418 is generated by the controller 420 when the conductance in the current loop 1004 is less than about ½ siemens.

An example technical effect of the apparatus and method described herein includes at least one of: (a) eliminating or reducing nuisance trips during double grounded neutral faults; (b) quickly and accurately determining when double grounded neutral faults are present in AC power line circuits; (c) filtering harmonic current noise from differential current measurements that may obscure or mask the analysis of the AC power line circuits; (d) utilizing load currents to determine if either a double grounded neutral fault or a ground fault is present even when the test signals are absent; and (e) mitigating the potential effects of current transformer saturation while analyzing the test signals injected into the neutral conductors of the AC power circuits by sampling the differential current measurements around zero-crossing events of the AC waveforms of the AC power circuits.

Example embodiments of apparatus and a method for detecting double grounded neutral faults in AC power line circuits are described above in detail. The apparatus and method and systems are not limited to the specific embodiments described herein, but rather, components of systems and/or steps of the methods may be utilized independently and separately from other components and/or steps described herein. For example, the method may also be used in combination with other components and are not limited to practice only with the AC power line circuits as described herein. Rather, the example embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A double grounded neutral fault detector, comprising:
   one or more induction circuits configured to:
   generate a leakage signal corresponding to a current imbalance between a line conductor and a neutral conductor for a load; and
   selectively inject a test signal into the neutral conductor, wherein a frequency of the test signal substantially corresponds to a utility frequency;
   an interrupter circuit configured to selectively disconnect the line conductor from the load in response to receiving a control signal; and
   a controller configured to:
   measure a first value of the leakage signal;
   determine if the first value is less than a first threshold value; and
   utilize the one or more induction circuits to begin injection of the test signal into the neutral conductor in response to determining that the first value is less than the first threshold value,
   the controller further configured, responsive to the one or more induction circuits injecting the test signal, to:
   measure a second value of the leakage signal;
   determine if the second value is greater than a second threshold value; and
   generate the control signal in response to determining that the second value of the leakage signal is greater than the second threshold value.

2. The double grounded neutral fault detector of claim 1, wherein:
   the controller is further configured to generate the control signal in response to determining that the first value of the leakage signal is greater than the first threshold value.

3. The double grounded neutral fault detector of claim 2, wherein:
   the controller is further configured to utilize the one or more induction circuits to end injection of the test signal into the neutral conductor in response to determining that the second value is less than the second threshold value.

4. The double grounded neutral fault detector of claim 1, further comprising:
   a filter configured to generate a band-limited version of the leakage signal having a bandwidth that includes the utility frequency and at least one corner frequency that is offset from the utility frequency by a threshold frequency,
   wherein the controller is further configured to measure the band-limited version of the leakage signal for the first value and the second value.

5. The double grounded neutral fault detector of claim 4, wherein:
   the utility frequency is one of 50 hertz and 60 hertz, and the threshold frequency is 3 hertz or less.

6. The double grounded neutral fault detector of claim 1, wherein the one or more induction circuits comprises:
   a current transformer, comprising:
   primary windings formed from the line conductor and the neutral conductor; and
   at least two secondary windings magnetically coupled to the primary windings,
   wherein a first one of the at least two secondary windings is configured to generate the leakage signal, and
   wherein a second one of the at least two secondary windings is configured to receive the test signal and to inject the test signal into the neutral conductor.

7. The double grounded neutral fault detector of claim 1, wherein the one or more induction circuits comprises:

a first current transformer, comprising:
  primary windings formed from the line conductor and the neutral conductor; and
  a secondary winding magnetically coupled to the primary windings and configured to generate the leakage signal; and
a second current transformer, comprising:
  a primary winding formed from the neutral conductor; and
  a secondary winding magnetically coupled to the primary winding and configured to receive the test signal and to inject the test signal into the neutral conductor.

8. A method of detecting a double grounded neutral fault, the method comprising:
  generating a leakage signal corresponding to a current imbalance between a line conductor and a neutral conductor for a load;
  measuring a first value of the leakage signal;
  determining if the first value is less than a first threshold value;
  begin injecting a test signal into the neutral conductor in response to determining that the first value is less than the first threshold value, wherein a frequency of the test signal substantially corresponds to a utility frequency;
  measuring a second value of the leakage signal in response to injecting the test signal;
  determining if the second value is greater than a second threshold value; and
  disconnecting the line conductor from the load in response to determining that the second value is greater than the second threshold value.

9. The method of claim 8, further comprising:
  disconnecting the line conductor from the load in response to determining that the first value is greater than the first threshold value.

10. The method of claim 8, further comprising:
  end injecting the test signal in response to determining that the second value is less than the second threshold value.

11. The method of claim 8, further comprising:
  filtering the leakage signal to generate a band-limited version of the leakage signal having a bandwidth that includes the utility frequency and at least one corner frequency that is offset by the utility frequency by a threshold frequency,
  wherein measuring the first value and the second value of the leakage signal further comprises:
  measuring a first value and a second value of the band-limited version of the leakage signal.

12. The method of claim 11, wherein filtering the leakage signal further comprises:
  filtering the leakage signal to generate the band-limited version of the leakage signal having a bandwidth of 6 hertz or less, wherein the bandwidth of the band-limited version of the leakage signal is substantially centered at one of 50 hertz and 60 hertz.

13. The method of claim 8, wherein injecting the test signal further comprises:
  injecting the test signal into the neutral conductor in response to determining that the first value of the leakage signal is less than the first threshold value.

14. An apparatus, comprising:
a controller configured to:
  receive a leakage signal corresponding to a current imbalance between a line conductor and a neutral conductor for a load;
  measure a first value of the leakage signal;
  determine if the first value is less than a first threshold value; and
  generate a test signal that is injected into the neutral conductor in response to determining that the first value is less than the first threshold value, wherein a frequency of the test signal substantially corresponds to a utility frequency,
the controller further configured to:
  measure a second value of the leakage signal while the test signal is being injected into the neutral conductor;
  determine if the second value is greater than a second threshold value; and
  generate a control signal that disconnects the line conductor from the load in response to determining that the second value is greater than the second threshold value.

15. The apparatus of claim 14, wherein:
the controller is further configured to generate the control signal to disconnect the line conductor from the load in response to determining that the first value of the leakage signal is greater than the first threshold value.

16. The apparatus of claim 14, wherein:
the controller is further configured to terminate the test signal in response to determining that the second value is less than the second threshold value.

17. The apparatus of claim 14, wherein:
the utility frequency is one of 50 hertz and 60 hertz.

18. The apparatus of claim 14, wherein:
the leakage signal has a bandwidth a bandwidth that includes the utility frequency and at least one corner frequency that is offset from the utility frequency by a threshold frequency of 3 hertz or less.

19. The apparatus of claim 14, further comprising:
a current transformer, comprising:
  primary windings formed from the line conductor and the neutral conductor; and
  at least two secondary windings magnetically coupled to the primary windings,
  wherein a first one of the at least two secondary windings is configured to generate the leakage signal, and
  wherein a second one of the at least two secondary windings is configured to receive the test signal and to inject the test signal into the neutral conductor.

20. The apparatus of claim 14, further comprising:
a first current transformer, comprising:
  primary windings formed from the line conductor and the neutral conductor; and
  a secondary winding magnetically coupled to the primary windings and configured to generate the leakage signal; and
a second current transformer, comprising:
  a primary winding formed from the neutral conductor; and
  a secondary winding magnetically coupled to the primary winding and configured to receive the test signal and to inject the test signal into the neutral conductor.

* * * * *